United States Patent [19]
Suzuki

[11] Patent Number: 5,989,085
[45] Date of Patent: Nov. 23, 1999

[54] TILT AND TRIM CONTROL FOR MARINE PROPULSION SYSTEM

[75] Inventor: Masaru Suzuki, Shizuoka, Japan

[73] Assignee: Sanshin Kogyo Kabushiki Kaisha, Japan

[21] Appl. No.: 09/139,528

[22] Filed: Aug. 25, 1998

[30] Foreign Application Priority Data

Aug. 25, 1997 [JP] Japan ................................. 9-227739

[51] Int. Cl.$^6$ .................................................. B63H 5/125
[52] U.S. Cl. .............................. 440/53; 440/77; 440/900; 361/730
[58] Field of Search ................................ 440/53, 61, 76, 440/77, 84, 900; 361/730

[56] References Cited

U.S. PATENT DOCUMENTS

| 4,843,520 | 6/1989 | Nakatani et al. ...................... 361/730 |
| 4,933,809 | 6/1990 | Boede et al. ............................... 440/77 |
| 5,105,334 | 4/1992 | Holinka ................................... 361/730 |

FOREIGN PATENT DOCUMENTS

WO 37/48568  12/1997  WIPO .

*Primary Examiner*—Stephen Avila
*Attorney, Agent, or Firm*—Knobbe, Martens, Olson & Bear, LLP

[57] ABSTRACT

A tilt and trim control system includes a simply-structured control unit that better protects its electrical components from contact with water and other contaminates. The control unit includes a pair of relays mounted onto to a printed circuit board. The board and the relays are potted within a housing. A plurality of wire leads are also attached to the printed circuit board with the connections between the leads and the board also being potted. The control unit is attached to the lower section of a cowling that surrounds an engine of the marine drive. The tilt and trim control system additionally includes a terminal block that is positioned within the cowling. The terminal block connects the control unit to a motor of a tilt and trim mechanism, and is positioned above the control unit on the engine. This position of the terminal block generally isolates the terminal block from water that may lie within the lower section of the cowling. The small size of the terminal block, however, does not interfere with the layout of other engine components.

11 Claims, 5 Drawing Sheets

TILT AND TRIM CONTROL FOR MARINE PROPULSION SYSTEM

BACKGROUND OF THE INVENTION

1. Field of the Invention

The present invention relates to an outboard drive of a watercraft, and in particular to an electronic control unit for a trim and trim system associated with an outboard drive, such as, for example an outboard motor.

2. Description of Related Art

The desirable trim angle of an outboard drive varies with a watercraft's running condition. For instance, the bow of the watercraft should press against the water when accelerating from rest or from a slow speed. To achieve this condition, the angle of the propeller shaft is disposed at a negative angle relative to the horizontal (i.e., at a negative trim angle). A thrust vector produced by the propeller in this position is thus out of the water. When running at high speed, the propeller is raised or trimmed to position the propeller shaft at a positive trim angle relative to the horizontal within the range of about 0° to 15°.

A hydraulic tilt and trim system often supports and adjusts the trim position of a large outboard motor (e.g., 150 hp or greater). The tilt and trim system includes hydraulic actuators that operate between a clamping bracket, which is attached to the watercraft, and a swivel bracket that supports the outboard motor. A pivot pin connects the swivel and clamping brackets together. The actuators cause the swivel bracket to pivot about the axis of the pivot pin relative to the stationary clamping bracket.

At least one fluid motor powers the actuators. The fluid motor includes a pump that pressurizes hydraulic fluid within the lines of the system. Various valves control the delivery of the pressurized fluid to the actuators. A reversible electric motor desirably drives the pump. By reversing the direction in which the pump is run, the actuators are either extended or retracted in order to raise or lower the outboard drive, respectively.

The actuators and fluid motor, as well as a reservoir in communication with the fluid motor, are positioned beneath the power head of the outboard motor. In many applications, these components lie generally between the swivel bracket and the clamping bracket.

A controller usually controls the operation of the fluid motor to control the reversible pump motor. The controller often employs relays within it circuitry to switch the direction of the pump motor. These electrical components are potted in order to shield and seal them from water and dirt.

While prior controllers are effective in performing this function, they often are difficult and costly to assemble. In addition, some controllers do not provide adequate protection of the components and circuitry. The resulting corrosion and dirt interfere with the proper functioning of the controller.

SUMMARY OF THE INVENTION

A need therefore exists for a simply-structured tilt and trim control system that adequately protects its electrical components.

An aspect of the present invention thus involves an outboard motor including a tilt ant trim system for moving the outboard motor between a raised position and a lower position. The outboard motor comprises a power head including an engine contained at least in part within a cowling. The cowling has a lower tray section positioned near a lower end of the engine. The tilt and trim control system comprises a motor coupled to a control unit via a terminal block. The control unit is control unit is connected to the cowling lower tray section and the terminal block is attached to the engine at a position above the control unit.

In one mode, the control unit comprises at least one relay having at least one external lead, a substrate support circuitry, and at least one connector lead. The connector lead and the relay lead are attached to the substrate by connections (e.g., solder connections) that electrically link the leads to the circuitry. At least the connections are encased within a protective material (e.g., potted in resin).

The electrical components of the tilt and trim control system thus are protected by placing the control unit and the terminal block within the cowling, encasing sensitive electrical connections of the control unit, and positioning the terminal block on the engine at positioned elevated above the lower tray section. The terminal block is less likely to come in contact with water that may enter the cowling and collect in the lower tray section.

BRIED DESCRIPTION OF THE DRAWINGS

These and other features of the invention will now be described with reference to the drawings of a preferred embodiment, which is intended to illustrate and not to limit the invention, and in which.

DESCRIPTION OF PREVIOUS TILT AND TRIM ELECTRONIC CONTROL UNTIS

Figure 1:
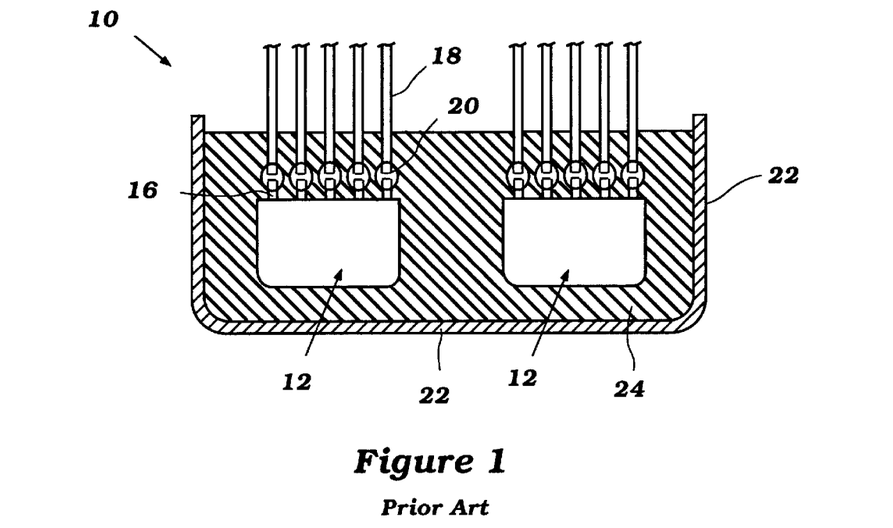
FIG. 1 is a partial cross-sectional view of an electronic control unit for a tilt and trim system that is configured in accordance with a previous design.

FIG. 1 illustrates a previous control unit 10 of a tilt and trim control system. The control unit 10 includes a pair of electrical-mechanical relays 12 housed within a case 14. External relay leads 16 extend from the case 14. Exposed ends of lead wires 18 are soldered onto the ends of the external leads 16 to form soldered joints 20. The lead wires 18 are shielded except near the soldered joints 20.

A housing 22 of the control unit contains the relays 12. A portion of the housing 22 is filled with a suitable potting material 24 (e.g., resin) to encase the relays 12, external relay leads 16, soldered joints 20 and at least the exposed end portions of the lead wires 18.

While this assembly provides good protection to the soldered joints 20 and the relays 12, the assembly process is complicated and uneconomical. The process of individually soldering each end of the lead wires to a specific relay lead is tedious and takes too long.

Figure 2:
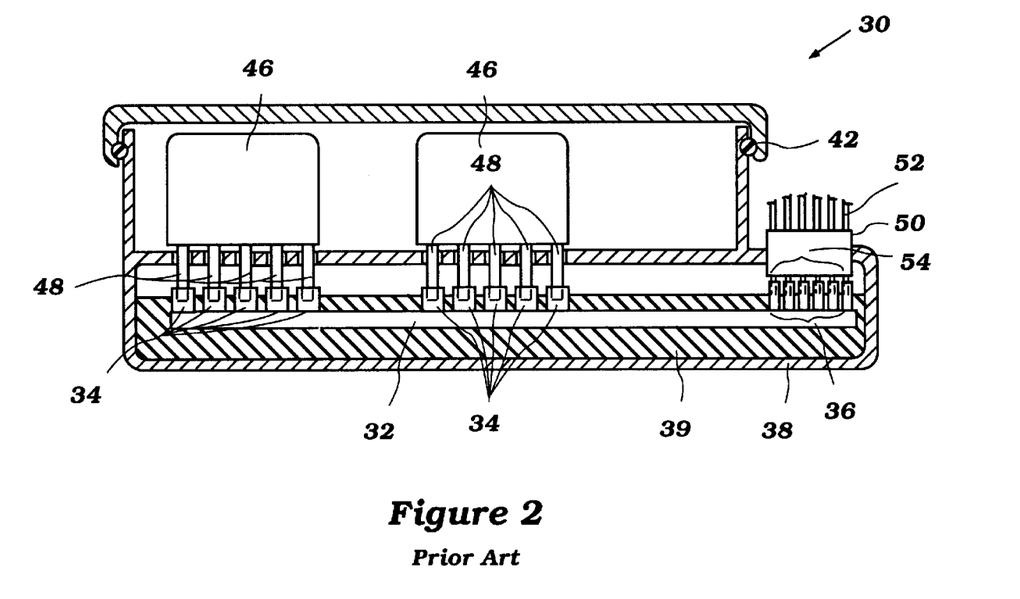
FIG. 2 is a partial cross-sectional view of an electronic control unit for a tilt and trim system that is configured in accordance with another previous design.

Another previously proposed construction of a control unit involves mounting the relays onto a printed circuit board. With reference to FIG. 2, a control unit 30 includes a printed circuit board 32 on which two sets of connection terminals 34 are mounted. An additional set of connection terminals 36 is also mounted to the printed circuit board 32 at one end of the board 32.

The printed circuit board 32 is housed within a first compartment of an enclosure 38 and is potted therein with the connection terminals 34, 36 being exposed. A suitable potting material 39 fills a portion of the first compartment, as seen in FIG. 2. An opening is formed at one end of the enclosure 38 above the additional set of connector terminals 36.

The enclosure 38 includes a second compartment. A removable cover 40 forms a portion of the second compartment. The cover 40 cooperates with side walls of the enclosure 38, and together with a gasket 42, generally seals the second compartment. A wall 44 between the first and second compartments includes a plurality of apertures.

A pair of relays 46 are positioned within the second compartment. The relays 46 include external leads 48 that extend through the apertures in the enclosure wall 44 and plug into the connector terminals 36 to electrically link the relays 46 to the circuitry on the printed circuit board 32.

A plurality of wire leads 50 terminate in a male connector. The connector 52 is inserted through the opening in the enclosure 38 and includes a plurality of pins 54. The connector pins 54 are spaced and sized to plug into the corresponding connector terminals 36 on the printed circuit board 32.

While this construction eases assembly, the plug-in connections between the relays 46 and the board 32 and between the connector 50 and board 32 are susceptible to corrosion and poor contact. Water and dirt may enter the first compartment of the enclosure 38 either through the opening through which the connector is inserted or through the second compartment when the cover is removed.

DETAILED DESCRIPTION OF THE PREFERRED EMBODIMENT

Figure 3:
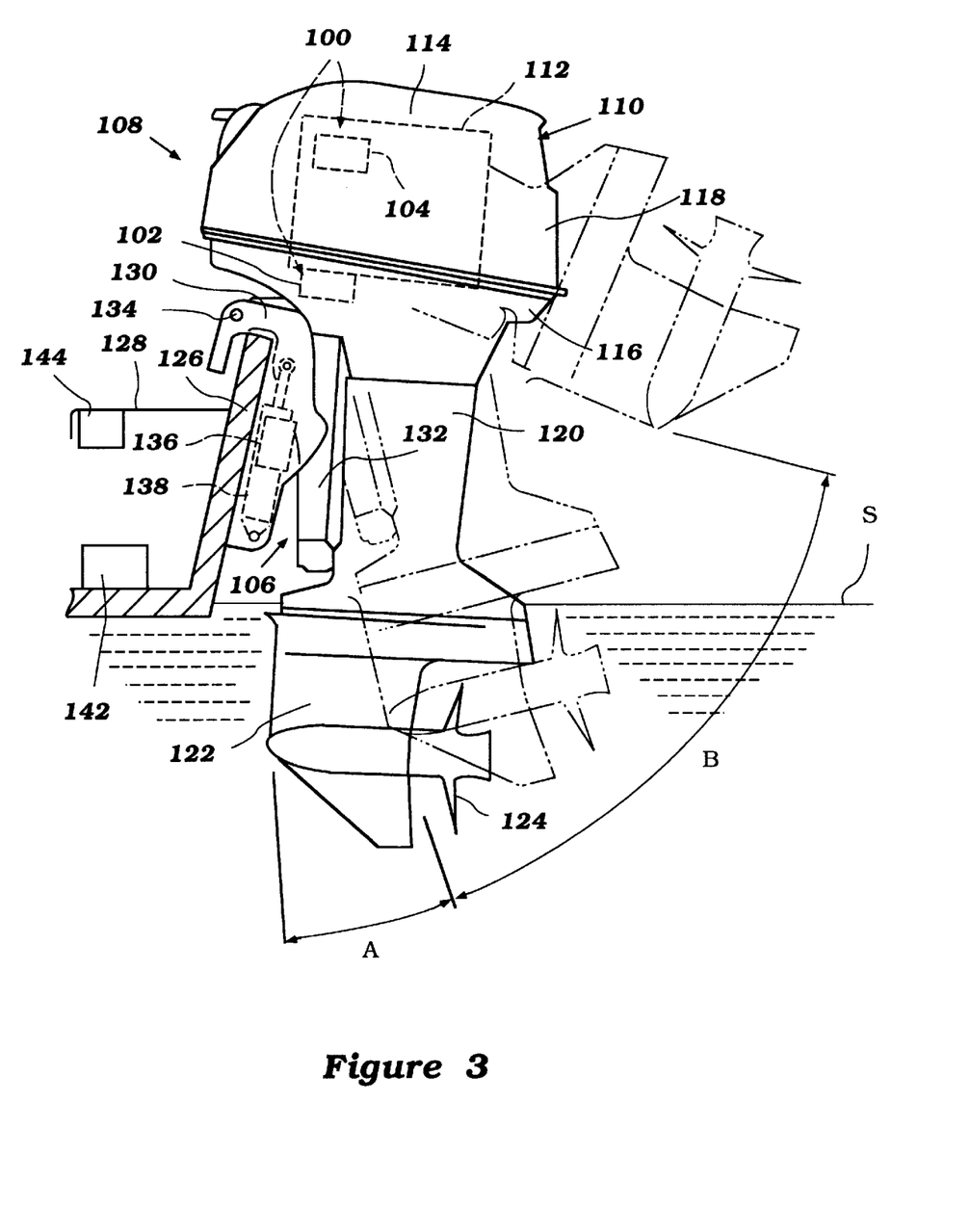
FIG. 3 is a side elevational view of a tilt and trim device supporting an outboard motor on a transom of a watercraft and being controlled by a control unit that is configured in accordance with a preferred embodiment of the present invention.

FIG. 3 illustrates a tilt and trim control system 100 which incorporates a control unit 102 configured in accordance with a preferred embodiment of the present invention. The control unit 102, as described below, is simply-structured and easier to manufacture than the control unit designs described above. In addition, the control unit 102, as well as a terminal block 104 of the tilt and trim control system 100, are positioned in order to isolate further the sensitive components of the system 100 from exposure to water.

The tilt and trim control system 100 is illustrated as part of a tilt and trim mechanism 106 that is used to raise and lower an outboard motor 108. This application, however, is exemplary. The tilt and trim control system 100 has applicability with a variety of other types of outboard drives, such as, for example, an outboard motor, or a stern drive of an inboard/outboard motor. Although the actual constructions of the outboard motor 108 and the tilt and trim mechanism 106 form no part of the invention, the following initially will describe the outboard motor 108 and tilt and trim mechanism 106 in order to provide the reader with an understanding of the illustrated environment of use.

The outboard motor 108 has a power head 110, which desirably includes an internal combustion engine 112. The internal combustion engine 112 can have any number of cylinders and cylinder arrangements, and can operate on a variety of known combustion principles (e.g., on a two-stroke or a four-stroke principle).

A protective cowling assembly 114 surrounds the engine 112. The cowling assembly 114 includes a lower tray 116 and a top cowling 118. The tray 116 and the cowling 118 together define a compartment, which houses the engine 112 with the lower tray 116 encircling a lower portion of the engine 112.

The engine 112 is mounted conventionally with its output shaft (i.e., a crankshaft) rotating about a generally vertical axis. The crankshaft drives a drive shaft, as known in the art. The drive shaft depends from the power head 110 of the outboard motor 108.

A drive shaft housing 120 extends downwardly from the lower tray 116 and terminates in a lower unit 122. The drive shaft extends through the drive shaft housing 120 and is suitably journaled therein for rotation about the vertical axis.

The drive shaft continues into the lower unit 122 to drive a propulsion shaft through a transmission. The propulsion shaft drives a propulsion device 124, which the lower unit 122 supports.

In the illustrated embodiment, the propulsion device 124 comprises a propeller. The propulsion device, however, which can take the form of a dual, counter-rotating propeller system, a hydrodynamic jet, or like propulsion device.

A coupling assembly of the tilt and trim mechanism 106 supports the outboard motor 108 on a transom 126 of the watercraft 128 so as to position the propulsion device 124 in a submerged position with the watercraft 128 resting on the surface S of a body of water. The coupling assembly is principally formed between a clamp bracket 130, a swivel bracket 132, a steering shaft (not illustrated), and a pivot pin 134.

The steering shaft is affixed to the drive shaft housing 120 through upper and lower brackets. An elastic isolator connects each bracket to the drive shaft housing 120. The elastic isolators permit some relative movement between the drive shaft housing 120 and the steering shaft and contain damping mechanisms for damping engine vibrations transmitted from the drive shaft housing 120 to the steering shaft.

The steering shaft is ratably journaled for steering movement about a steering axis within the swivel bracket 132. A tiller (not shown) can be attached to an upper end of the steering shaft to steer the outboard motor 108, in a known manner. Rotation of the tiller rotates the steering shaft, as well as the drive shaft housing 120 which is connected through the upper and lower brackets about the steering axis.

The swivel bracket 132 includes a cylindrical housing through which the steering shaft extends. A plurality of bearing assemblies journal the steering shaft within the cylindrical housing. In the illustrated embodiment, upper and lower needle bearing assemblies support the steering shaft within the cylindrical housing.

The swivel bracket 132 also includes a pair of lugs that project forwardly toward the watercraft transom 126. Each lug includes a coupling hole at its front end. The coupling holes are aligned with each other along a common pivot axis.

The clamping bracket 130 is affixed in a conventional manner to the transom 16. The clamping bracket 130 includes a support plate. The support plate abuts the outer surface of the transom 126 when the clamping bracket 130 is attached to the watercraft 128.

A pair of flanges project toward the outboard motor 108 from the sides of the support plate. The flanges are spaced apart from each other by a sufficient distance to receive the swivel bracket 132 between the flanges. The flanges also shield the space between the support plate 54 and the swivel bracket 132 to protect the inner components of the tilt and trim mechanism 106.

Upper arms extend from the upper ends of the flanges and into the watercraft 128. The upper arms include coupling holes positioned at the front end of the arms. The coupling holes of the arms are aligned with the coupling holes of the swivel bracket lugs along the common pivot axis.

The pivot pin 134 completes the hinge coupling between the clamping bracket 130 and the swivel bracket 132. The pivot pin 134 extends through the aligned coupling holes of the clamping bracket arms and the swivel bracket lugs and is fixed to the clamping bracket arms. The inner surfaces of the coupling holes through the swivel bracket lugs act as bearing surfaces as the swivel bracket 132 rotates about the pivot pin 134. The outboard motor 108 thus can be pivoted about the pivot axis defined by the pivot pin 134, through a continuous range of trim positions (as schematically illustrated by arc A in FIG. 3). In addition, the pivotal connection permits the outboard motor 10 to be tilted up and out of the water for storage or transport, as known in the art (as schematically illustrated by arc B in FIG. 3).

A hydraulically-operated tilt and trim mechanism operates between the clamping bracket 130 and the swivel bracket 132 to effectuate the tilt and trim movement of the outboard motor 108. In the illustrated embodiment, the tilt and trim mechanism comprises a hydraulic fluid motor 136 and an actuator cylinder 138.

The actuator 138 includes an outer cylinder that defines a cylinder bore. A mounting lug projects from the bottom of the cylinder 138. A hole extends through the lug. The hole receives a support shaft that couples the lower end of the cylinder 138 to the lower end of the clamping bracket 130.

A piston slides within the bore with upper and lower fluid chamber being formed on either side of the piston within the cylinder bore. A piston rod is affixed to the piston and extends upwardly through an upper sealed end of the cylinder 138. The piston rod terminates in a trunnion.

A pivot pin connects the trunnion of the cylinder 138 to the swivel bracket 132. The pivot pin extends between a pair of inner lugs. The inner lugs are symmetrically positioned relative to the steering axis and lie between the upper lugs of the swivel bracket 132.

So coupled, the motor cylinder 138 extends between the bottom of the clamping bracket 130 and the inner lug of the swivel bracket 132 at a central position between the upper lugs and upper arms of the swivel and clamping brackets 130, 132, respectively. The stroke axis of the piston rod generally lies within the same vertical plane in which the steering axis lies. The stroke axis also extends at an angle that is slightly skewed from the vertical.

Although not illustrated, the cylinder 138 desirably includes a hydraulic shock-absorbing mechanism for resisting "pop-up" of the outboard motor 108 about the pivot axis during reverse thrust operation. The shock-absorbing mechanism also allows of the outboard motor 108 to rise up when the lower unit 122 of the outboard motor 108 strikes an underwater obstacle, and then to return to the established trim position once the lower unit 122 clears the underwater obstacle.

The hydraulic motor 136 and associated circuit powers and controls the cylinder 138. The motor includes a pump driven by a reversible electric motor 140 (see FIG. 4). Any of a variety of conventional hydraulic circuits can be used with the tilt and trim fluid motor assembly. Because the hydraulic circuit forms no part of the present invention, a further description is not believed necessary for an understanding of the present invention.

As well know in the art, when the hydraulic motor 136 pressurizes the cylinder bores below the pistons of the cylinder 138, the pistons move upward and exerts a force through the piston rod on the swivel bracket 132 so as to raise (i.e., trim-up) the outboard motor 108. The swivel bracket 132 rotates about the pivot pin 134 under the force of the cylinder 138. Lowering (i.e., trim-down) of the of outboard motor 108 is accomplished in a similar manner, but in the opposite direction.

A battery 142 is located within the watercraft in the illustrated embodiment. The battery 142 desirably powers the hydraulic motor 136.

A tilt and trim actuator switch 144 controls the hydraulic motor 136 so as to effect tilt and trim movement of the outboard motor 108. The tilt and trim switch 144 can be positioned within the watercraft 128 at a position remote to the outboard motor 108 (e.g., next to a remote steering control).

Figure 4:
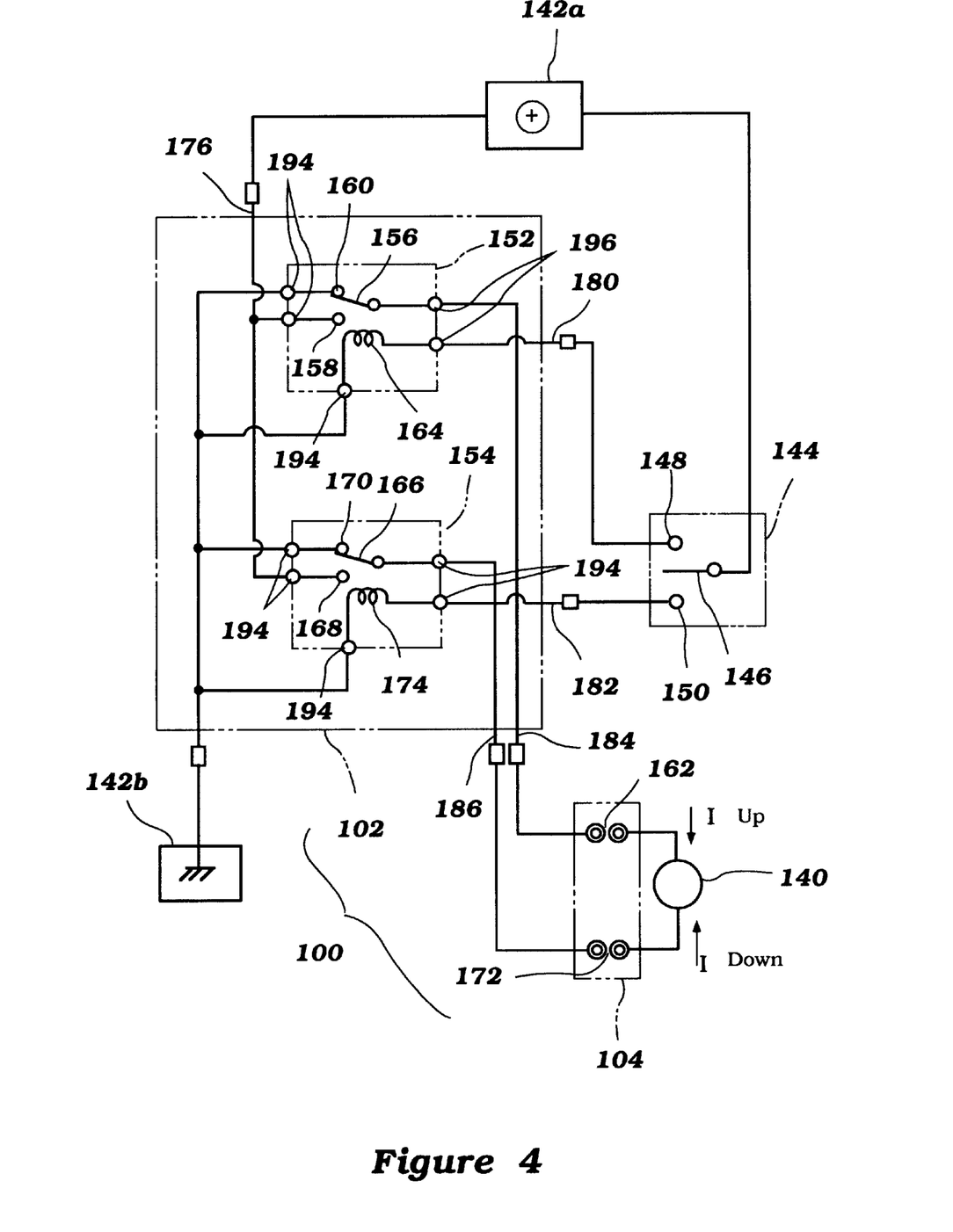
FIG. 4 is a schematic drawing of an electronic circuitry of the control unit of FIG. 3.

FIG. 4 schematically illustrates the circuitry of the tilt and trim control system 100 in combination with the tilt and trim switch 144, the battery 142 and the reversible motor 140. The battery positive terminal 142a and negative terminal 142b are separated in order to simplify the drawing. The tilt and trim switch desirably comprises a single throw, two-pole switch. The switch 144 includes a switch terminal 146 that is selectively moved into contact with an up contact 148 and a down contact 150. The switch terminal 146 desirably is biased toward a central position between the contacts 148, 150. Each contact 148, 150 of the switch 144 is connected to wire leads that extend from the control unit 102, as described below. The switch terminal 146 is connected to the positive terminal 142a of the battery 142.

The control unit 102 includes a pair of relays: an up relay 152 and a down relay 154. The up relay 152 includes a switch element having a relay terminal 156 that selectively contacts an ON contact 158 and an OFF contact 160. The ON contact 158 is connected to the positive terminal 142a of the battery 142, while the OFF contact 160 is connected to the negative terminal 142b of the battery 142. The relay terminal 156 of the up relay 152 is connected to a first terminal 162 of the terminal block 104.

The up relay 152 also includes a driving coil 164 that is selectively energized so as to actuate the relay terminal 156 between the contacts 158, 160. The driving coil 164 is connected between the up contact 148 of the tilt and trim switch 144 and the negative terminal 142b of the battery 142.

Similarly, the down relay 154 includes a switch element having a relay terminal 166 that selectively contacts an ON contact 168 and an OFF contact 170. The ON contact 168 is connected to the positive terminal 142a of the battery 142, while the OFF contact 170 is connected to the negative terminal 142b of the battery 142. The relay terminal 166 of the down relay 154 is connected to a second terminal 172 of the terminal block 104. The down relay 154 also includes a driving coil 174 that is selectively energized so as to actuate the relay terminal 166 between the contacts 168, 170. The driving coil 174 is connected between the down contact 150 of the tilt and trim switch 144 and the negative terminal 142b of the battery 142.

The control unit 106 includes six wire leads. A first wire lead 176 is detachably connected to the positive terminal 142a of the battery 142. The wire lead 176 thus is also connected to the ON contacts 158, 168 of the relays 152, 154 via internal circuitry within the control unit 102. A second wire lead 178 is detachably connected to the negative terminal 142b of the battery. The second wire lead 178 thus also is connected to the OFF contacts 160, 170 of the relays 152, 154 via internal circuitry within the control unit 102. Third and fourth wire leads 180, 182 are detachably connect the up and down contacts 148, 150 and connected to the corresponding driving coils 164, 174 of the up and down relays 152, 154, respectively, via internal circuitry within the control unit 102. Similarly, fifth and sixth wire leads 184, 186 are detachably connected to the first and second terminals 162, 172 of the terminal block 104 and connected to the respective relay terminals 156, 166 via internal circuitry within the control unit 102.

The first and second terminals 162, 172 are connected to opposite sides of the motor armature of the pump motor 140. By reversing the current flow through the motor 140, the direction in which the pump operates can be reversed.

Figure 5:
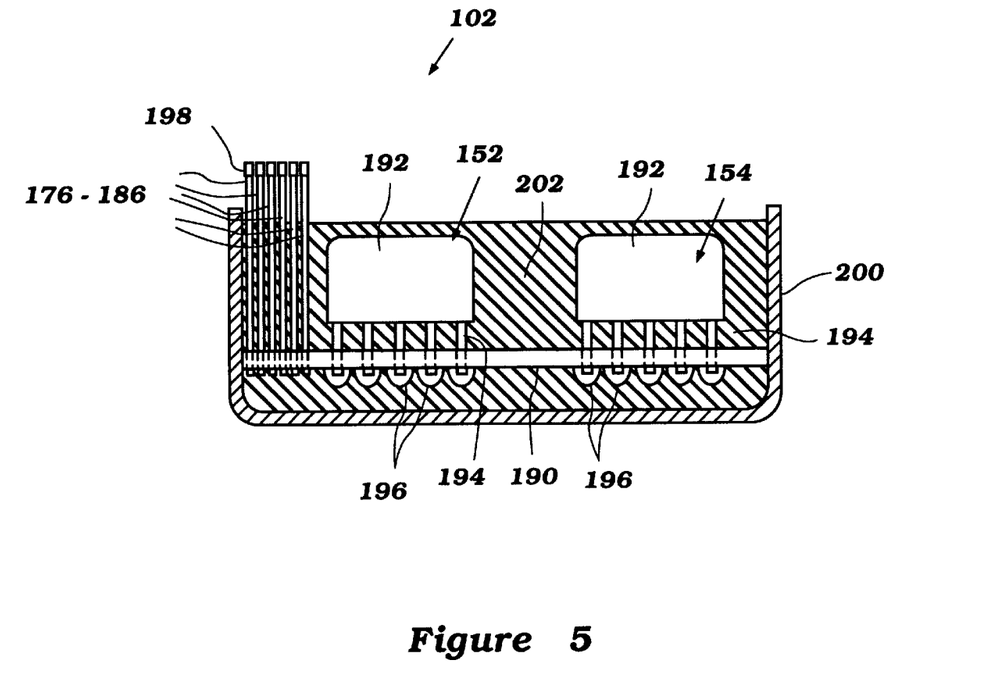
FIG. 5 is a cross-sectional view of control unit illustrating the connection between several components of the control unit.

FIG. 5 illustrates a preferred construction of the control unit 102. The control unit includes a substrate 190, such as, for example, a printed circuit board, which include a circuit pattern effectuating the circuitry diagramed in FIG. 4.

The up and down relays 152, 152 are mounted to the substrate 190. In the illustrated embodiment, the each of the relays 152, 154 includes a case 192 that houses the corresponding switch element and driving coil. Five external relay leads 194 extend from the case 190. (These leads 194 are schematically illustrated in FIG. 4.) The leads 194 are attached to the substrate 190. The relay leads 194 desirably are attached to the substrate 190 by through-hole attachment with soldered connections 196 physically and electrically connecting the leads 194 to the substrate 190 and the circuit on the substrate 190.

The six connector leads 176–186 are also connected to the substrate 190 by through-hole attachment with soldered connections 196. The soldered connections 196 physically connect the leads 176–186 to the substrate 190, as well as electrically link the leads to the circuit on the substrate 190. The connector leads 176–186 includes detachable connectors 198 at exposed ends of the leads 176–186. These connectors 198 attach the leads 176–186 to the respective electrical components, as described above.

The substrate 190 and the relays 152, 154 are contained within a housing 200 with the substrate 190 being situated at the bottom of the housing 200. The housing 200 desirably is filled with a suitable potting material 202 (e.g., resin or metal alloy) to encase at least the substrate 190 and the soldered connections 196. The exposed leads 194 of the relays 152, 154 are also preferably potted, and more preferably, both relays 152, 154 are entirely potted.

Figure 6:
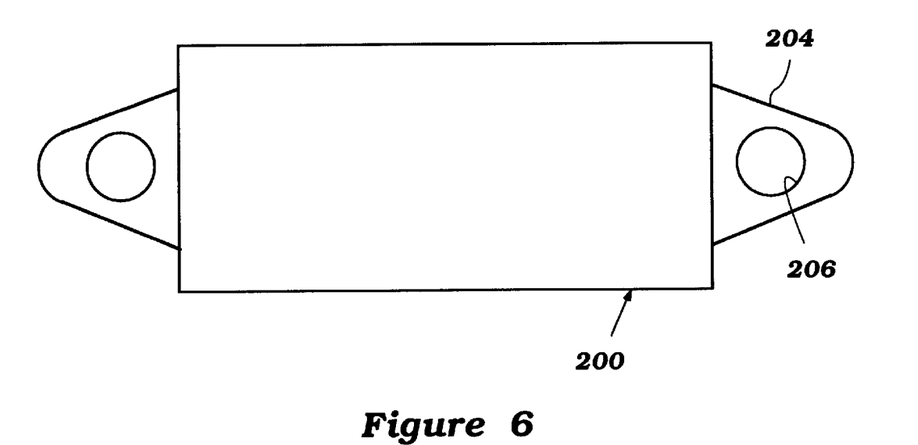
FIG. 6 is a top plan view of a housing of the control unit of FIG. 5.

As seen in FIG. 6, the housing 200 includes a pair of mounting flanges 204 with through holes 206. The flanges 204 are used to secure the housing to the lower tray 116 of the outboard motor 108, as described above.

Figure 7:
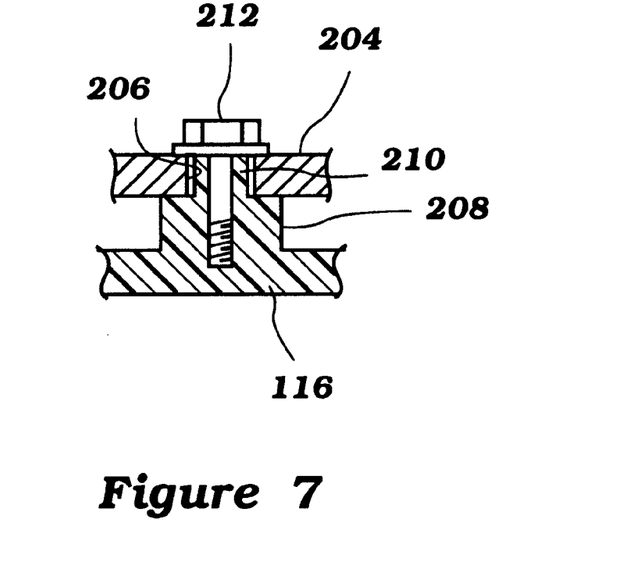
FIG. 7 is a partial cross-sectional view of a mounting flange of the control unit housing attached to a cowling of the outboard motor in accordance with one preferred mounting arrangement.

With reference to FIG. 7, the lower tray 116 of the cowling 114 includes a pair of bosses 208 that project upward from the lower tray 116. Each boss 208 includes a neck section 210, which has a diameter size smaller than the through holes 206 of the housing mounting flanges 204. In this manner, the flanges 204 can rest on top of the bosses 208 with the neck portions 210 of the bosses 208 extending at least partially through the through holes 206.

Each boss 208 also includes a threaded hole that extends into the boss 208 in a direction towards the lower wall of the lower tray 116. A fastener 212 is threaded into the hole to hold the corresponding mounting flange 206 onto the boss 208. In this manner, the housing 200 is secured to the lower tray 116 at a position near the lower end of the engine 112. In the illustrated embodiment, these bosses 208 are desirably formed so as to position the housing 200 to the side of, and possibly partially beneath, the lower end of the engine 112.

Figure 8:
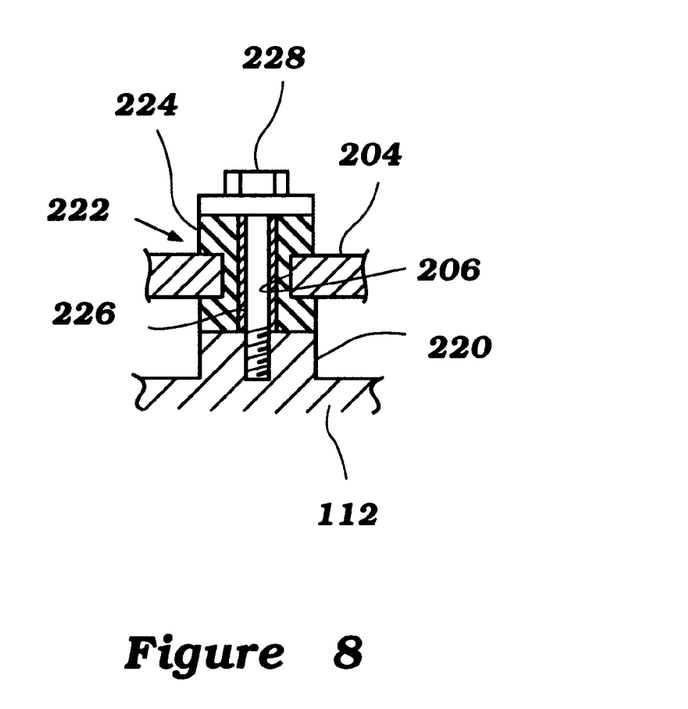
FIG. 8 is a partial cross-sectional view of the mounting flange of the control unit housing attached to an engine of the outboard motor in accordance with another preferred mounting arrangement.

FIG. 8 illustrates an alternative arrangement where the housing 200 is secured onto a lower section of the engine 112. In this variation, bosses 220 are formed on the engine 112. A mount 222 supports each mounting flange 204 on the corresponding boss 220. The mount 222 desirably includes a cylindrical body 224, which is formed of rubber or other elastomer, and includes an inner collar 226 formed of a relatively rigid material. The inner collar 226 forms an inner bore which receives a fastener 228 that cooperates with a threaded hole in the boss 220. The mount 222 in this manner supports the flange 204 on the engine 112 while generally thermally isolating the flange 204 from the engine 112. This type of mounting arrangement also can be used to secure the terminal block 104 to the side of the engine 112.

The configuration of the control unit 102 and the mounting arrangement of the control unit 102 and the terminal block 104 within the cowling 114 generally isolates these electrical components from the effect of dirt and water. In addition, the sensitive electrical connections between the circuitry and the electric components of the control unit 102 is further shielded by encasing (e.g., potting) these elements. The construction of the control unit 102, however, is simplified. The relatively small-sized terminal block 104 is also separated from the control unit 102 so as to position the terminal block 104 at a location less likely to be splashed by water. The small size of the terminal block 104, however, does not interfere with the arrangement or layout of other engine components on the side of the engine 112. The terminal block 104 facilitates convenient detachment of the control unit 102 from the fluid motor 140, for repair or replacement of either component.

The operation of the tilt and trim control system 100 will now be described in reference to FIGS. 3 and 4. In order to raise the outboard motor 108, the tilt and trim actuator switch 144 is moved so as to place the switch terminal 146 in contact with the up-contact 148 of the switch 144. As a result, the positive terminal 142a of the battery 142 is connected to one side of the drive coil 164 of the up-relay 152 and the negative terminal 142b of the battery 142 is connected to the other side of the drive coil 164. The resulting magnetic field causes the terminal 156 to be thrown into contact with the ON contact 158 of the up-relay 152. As a result, the positive terminal of the battery 142 is connected to the first terminal 162 of the terminal block 104, and thus to the first side of the motor 140. The other side of the motor 140 is connected to the negative terminal 142b of the battery 142 through the down-relay 154 because the relay terminal 166 of the down-relay 154 is normally biased into contact with the OFF contact 170 of the down relay 154. Current thus flows through the motor coil in a first direction as schematically indicated in FIG. 4.

In order to lower the outboard drive 108, the switch 144 is moved so as to place the switch terminal 146 in contact with the down-contact 150. The drive coil 174 of the down-relay 154 is thus connected to the battery 142. As a result, the relay terminal 166 is thrown into contact with the ON contact 168 of the down-relay 154. The positive terminal 142*a* of the battery 142 thus is placed into contact with the second terminal 172 of the terminal block, and thus into contact with the second side of the motor coil. The other side of the motor coil is connected to the negative terminal 152*b* of the battery via the up-relay 152. In particular, because the relay terminal 156 of the up-relay 152 is normally biased into contact with the OFF contact 160, the fifth wire lead 184 is connected to the negative terminal 142*b* of the battery while the up-relay 152 is de-energized. Current, as a result, flows from the second side of the motor coil to the first side in order to run the motor in reverse, as schematically indicated in FIG. 4.

Although this invention has been described in terms of a certain preferred embodiment and variations thereof, other embodiments apparent to those of ordinary skill in the art are also within the scope of this invention. Accordingly, the scope of the invention is intended to be defined only by the claims that follow.

What is claimed is:

1. An outboard motor comprising a power head including an engine contained at least in part within a cowling, the cowling having a lower tray section positioned near a lower end of the engine, a tilt and trim system for moving the outboard motor between a raised position and a lowered position, the tilt and trim control system comprising a motor coupled to a control unit via a terminal block, the control unit being connected to the lower tray section of the cowling and the terminal block being attached to the engine.

2. An outboard motor as in claim 1, wherein the control unit and the terminal block are positioned entirely within the cowling.

3. An outboard motor as in claim 2, wherein the motor of the tilt and trim system is positioned outside of the cowling.

4. An outboard motor as in claim 1, wherein the control unit comprises at least one relay having at least one external lead, a substrate supporting circuitry, and at least one connector lead, the at least one connector lead and the at least one relay lead being attached to the substrate by connections that electrically link the leads to the circuitry, at least the connections being encased within a protective material.

5. An outboard motor as in claim 4, wherein the control unit additionally comprises a housing that is attached to the lower tray section of the cowling, and the protective material fills at least a portion of the housing to pot at least a portion of the substrate, at least a portion of the connector lead, and at least a portion of the relay lead.

6. An outboard motor as in claim 4, wherein the protective material is a resin.

7. An outboard motor as in claim 4, wherein the relay includes a switch element and a driving coil that selectively actuates the switch element, the switch and driving coil being housed within a relay case from which the at least one relay lead extends.

8. An outboard motor as in claim 1, wherein the lower tray section of the cowling surrounds the lower end of the engine.

9. A control unit of a tilt and trim system for raising and lowering an outboard motor, said control unit comprising at least one relay, the relay including a switch element and a drive coil that selectively actuates the switch element, the switch element and the drive coil being housed within a case, a plurality of external relay leads extending from the case, a plurality of connector leads, a substrate supporting circuitry, solder connections attaching the plurality of relay leads and the plurality of connector leads to the substrate so as to communicate with the circuitry, and a housing containing the substrate and the relay, at least a portion of the substrate and the solder connections between the substrate and the external relay leads and the connector leads being encased within a protective material within the housing.

10. A control unit of claim 9, wherein the protective material encases the entire relay including the external leads.

11. A control unit of claim 9, wherein the protective material is a resin.

\* \* \* \* \*